United States Patent
Yata

(10) Patent No.: US 8,242,861 B2
(45) Date of Patent: Aug. 14, 2012

(54) ACOUSTIC WAVE FILTER DEVICE

(75) Inventor: Masaru Yata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 199 days.

(21) Appl. No.: 12/773,103

(22) Filed: May 4, 2010

(65) Prior Publication Data

US 2010/0207707 A1  Aug. 19, 2010

Related U.S. Application Data

(63) Continuation of application No. PCT/JP2009/000890, filed on Feb. 27, 2009.

(30) Foreign Application Priority Data

Mar. 27, 2008  (JP) .................................. 2008-083631

(51) Int. Cl.
*H03H 9/64* (2006.01)
(52) U.S. Cl. ........................................ 333/193; 333/195
(58) Field of Classification Search .......... 333/193–196; 310/313 R–313 D
See application file for complete search history.

(56) References Cited

U.S. PATENT DOCUMENTS

| | | | | |
|---|---|---|---|---|
| 6,201,457 B1 * | 3/2001 | Hickernell | ..................... | 333/193 |
| 6,452,306 B1 * | 9/2002 | Inoue et al. | ............... | 310/313 A |
| 6,489,863 B2 * | 12/2002 | Taniguchi | ..................... | 333/193 |
| 7,042,133 B2 * | 5/2006 | Kanna | ....................... | 310/313 A |
| 7,688,161 B2 * | 3/2010 | Miura et al. | .................. | 333/193 |
| 7,737,603 B2 * | 6/2010 | Kando | ...................... | 310/313 R |
| 2004/0140866 A1 | 7/2004 | Taniguchi | | |
| 2004/0227587 A1 | 11/2004 | Inoue et al. | | |
| 2006/0071579 A1 | 4/2006 | Kando | | |
| 2007/0090898 A1 | 4/2007 | Kando | | |
| 2009/0224852 A1 | 9/2009 | Shibahara | | |

FOREIGN PATENT DOCUMENTS

| | | |
|---|---|---|
| JP | 07-283688 A | 10/1995 |
| JP | 08-065089 A | 3/1996 |
| JP | 2004-242281 A | 8/2004 |
| JP | 2004-343168 A | 12/2004 |
| JP | 2005-5763 A | 1/2005 |
| WO | 2004/070946 A1 | 8/2004 |
| WO | 2005/060094 A1 | 6/2005 |
| WO | 2007/007475 A1 | 1/2007 |

OTHER PUBLICATIONS

Official Communication issued in corresponding Japanese Patent Application No. 2010-505295, mailed on Nov. 29, 2011.
Official Communication issued in International Patent Application No. PCT/JP2009/000890, mailed on May 12, 2009.

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

An acoustic wave filter device is capable of increasing the steepness of a filter characteristic at a boundary between a passband and an attenuation band and achieving a low loss in the passband. The acoustic wave filter device has a ladder circuit configuration including a plurality of series arm resonators and at least one parallel arm resonator. The anti-resonant frequency of the series arm resonator is different from that of the series arm resonator. The series arm resonator having the lowest anti-resonant frequency has a resonant frequency located in the passband and an electromechanical coupling coefficient less than an average of electromechanical coupling coefficients of the series arm resonators.

7 Claims, 7 Drawing Sheets

ACOUSTIC WAVE FILTER DEVICE

BACKGROUND OF THE INVENTION

1. Field of the Invention

The present invention relates to acoustic wave filter devices that are used as, for example, bandpass filters for mobile telephones, and, more particularly, to an acoustic wave filter device having a ladder circuit configuration.

2. Description of the Related Art

Surface acoustic wave filter devices having a ladder circuit configuration are widely used as bandpass filters for mobile telephones. For example, Japanese Unexamined Patent Application Publication No. 2004-343168 discloses a filter device having a circuit configuration illustrated in FIG. 14. A filter device 101 has a ladder circuit configuration. In a series arm connecting an input terminal 102 and an output terminal 103 to each other, a plurality of series arm resonators 111 to 113 are connected in series with each other. A plurality of parallel arm resonators 114 to 117 are connected to the series arm so as to form parallel arms.

A capacitor 118 is connected in parallel to the parallel arm resonator 114, so that the effective electromechanical coupling coefficient of the parallel arm resonator 114 is lower than that of the parallel arm resonators 115 to 117. As a result, a filter characteristic is abruptly changed at the end portion of a passband.

WO2004/070946 discloses the relationship between a propagation direction ψ of a piezoelectric monocrystal substrate of an acoustic wave filter device and an electromechanical coupling coefficient $k^2$ thereof. The acoustic wave filter device has a configuration in which an Au electrode is formed on an $LiNbO_3$ substrate with Euler angles (0°, 105°, ψ) and an $SiO_2$ film is further formed on the surface of the $LiNbO_3$ substrate. A method of freely changing the value of the electromechanical coupling coefficient $k^2$ within a range of 16% to 0% by changing the value of the propagation direction ψ is disclosed. That is, when the value of the propagation direction ψ is increased, the electromechanical coupling coefficient is monotonically reduced.

In bandpass filters, the amount of attenuation is preferably small in a passband and large outside the passband and the steepness of a filter characteristic is preferably high at boundaries therebetween. In the filter device 101 disclosed in Japanese Unexamined Patent Application Publication No. 2004-343168, in order to reduce the value of the electromechanical coupling coefficient of the parallel arm resonator 114, the capacitor 118 is connected in parallel to the parallel arm resonator 114. As a result, the steepness of a filter characteristic is increased.

In the filter device 101 disclosed in Japanese Unexamined Patent Application Publication No. 2004-343168, it is possible to increase the steepness of a filter characteristic. However, since the anti-resonant frequency of the parallel arm resonator 114 is located at an end portion of the passband, a loss is increased in the passband when the steepness of a filter characteristic is increased on a lower-frequency side of the passband.

SUMMARY OF THE INVENTION

To overcome the problems described above, preferred embodiments of the present invention provide an acoustic wave filter device having a ladder circuit configuration which has outstanding steepness of a filter characteristic and a low loss in a passband.

A first preferred embodiment of the present invention provides an acoustic wave filter device having a ladder circuit configuration. The acoustic wave filter device includes a plurality of series arm resonators connected in series with one another at a series arm connecting an input terminal and an output terminal, and a parallel arm resonator disposed at a parallel arm connected between each of the plurality of series arm resonators and a ground potential. An anti-resonant frequency of at least one of the plurality of series arm resonators is different from that of the remaining ones of the plurality of series arm resonators. One of the plurality of series arm resonators having the lowest anti-resonant frequency has a resonant frequency located in a passband and an electromechanical coupling coefficient $k^2$ that is less than an average of electromechanical coupling coefficients of all of the plurality of series arm resonators.

In the acoustic wave filter device according to the first preferred embodiment of the present invention, a plurality of parallel arm resonators are individually arranged at a plurality of parallel arms, a resonant frequency of at least one of the plurality of parallel arm resonators is different from that of remaining ones of the plurality of parallel arm resonators, and one of the plurality of parallel arm resonators having the highest resonant frequency has an anti-resonant frequency located in a passband and an electromechanical coupling coefficient less than an average of electromechanical coupling coefficients of all of the plurality of parallel arm resonators. In this case, the steepness of a filter characteristic on a higher-frequency side of a passband is increased by a series arm resonator having a relatively small electromechanical coupling coefficient, and the steepness of a filter characteristic on a lower-frequency side of the passband is also increased by a parallel arm resonator having a relatively small electromechanical coupling coefficient. Accordingly, an acoustic wave filter device having an outstanding steepness of a filter characteristic is provided.

The acoustic wave filter device according to the first preferred embodiment of the present invention preferably further includes a piezoelectric substrate made of a piezoelectric monocrystal, and electrodes provided on the piezoelectric substrate. A propagation direction ψ obtained when a crystalline cutting plane of the piezoelectric substrate and an acoustic wave propagation direction are expressed as Euler angles (φ, θ, ψ) is selected so that an electromechanical coupling coefficient of one of the plurality of series arm resonators having the lowest anti-resonant frequency is less than an average of electromechanical coupling coefficients of all of the plurality of series arm resonators. In this case, by setting only an Euler angle ψ as a propagation direction selected as described previously even on the same piezoelectric substrate, an acoustic wave filter device capable of increasing the steepness of a filter characteristic can be provided.

A second preferred embodiment of the present invention provides an acoustic wave filter device that includes a series arm resonator arranged to form a series arm between an input terminal and an output terminal, and a plurality of parallel arm resonators that are individually disposed at a plurality of parallel arms connecting the series arm and a ground potential. A resonant frequency of at least one of the plurality of parallel arm resonators is different from that of remaining ones of the plurality of parallel arm resonators. One of the plurality of parallel arm resonators having the highest resonant frequency has an anti-resonant frequency located in a passband and an electromechanical coupling coefficient less than an average of electromechanical coupling coefficients of all of the plurality of parallel arm resonators.

The acoustic wave filter device according to the second preferred embodiment of the present invention preferably further includes a piezoelectric substrate made of a piezoelectric monocrystal, and electrodes provided on the piezoelectric substrate. A propagation direction ψ obtained when a crystalline cutting plane of the piezoelectric substrate and an acoustic wave propagation direction are expressed as Euler angles (φ, θ, ψ) is selected so that an electromechanical coupling coefficient of one of the plurality of parallel arm resonators having the lowest anti-resonant frequency is less than an average of electromechanical coupling coefficients of all of the plurality of parallel arm resonators. In this case, by setting only an Euler angle ψ as a propagation direction selected as described previously even on the same piezoelectric substrate, an acoustic wave filter device capable of increasing the steepness of a filter characteristic can be provided.

An acoustic wave filter according to preferred embodiments of the present invention may be a boundary acoustic wave filter device using a boundary acoustic wave or a surface acoustic wave filter device using a surface acoustic wave.

According to the first preferred embodiment of the present invention, an anti-resonant frequency of at least one of the plurality of series arm resonators is lower than that of remaining ones of the plurality of series arm resonators, and one of the plurality of series arm resonators having a relatively low anti-resonant frequency has a resonant frequency located in a passband and a relatively small electromechanical coupling coefficient $k^2$. Accordingly, it is possible to increase the steepness of a filter characteristic on a higher-frequency side of a passband and reduce an insertion loss in the passband.

According to the second preferred embodiment of the present invention, a resonant frequency of at least one of the plurality of parallel arm resonators is set to a relatively high frequency, and one of the plurality of parallel arm resonators having the highest resonant frequency has an anti-resonant frequency located in a passband and a relatively small electromechanical coupling coefficient. Accordingly, it is possible to increase the steepness of a filter characteristic on a lower-frequency side of a passband and reduce an insertion loss in the passband.

According to the first and second preferred embodiments of the present invention, an acoustic wave filter device that is capable of increasing the steepness of a filter characteristic at a boundary between a passband and an attenuation band and achieving a low loss in the passband can be provided.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

First Preferred Embodiment

Figure 1:
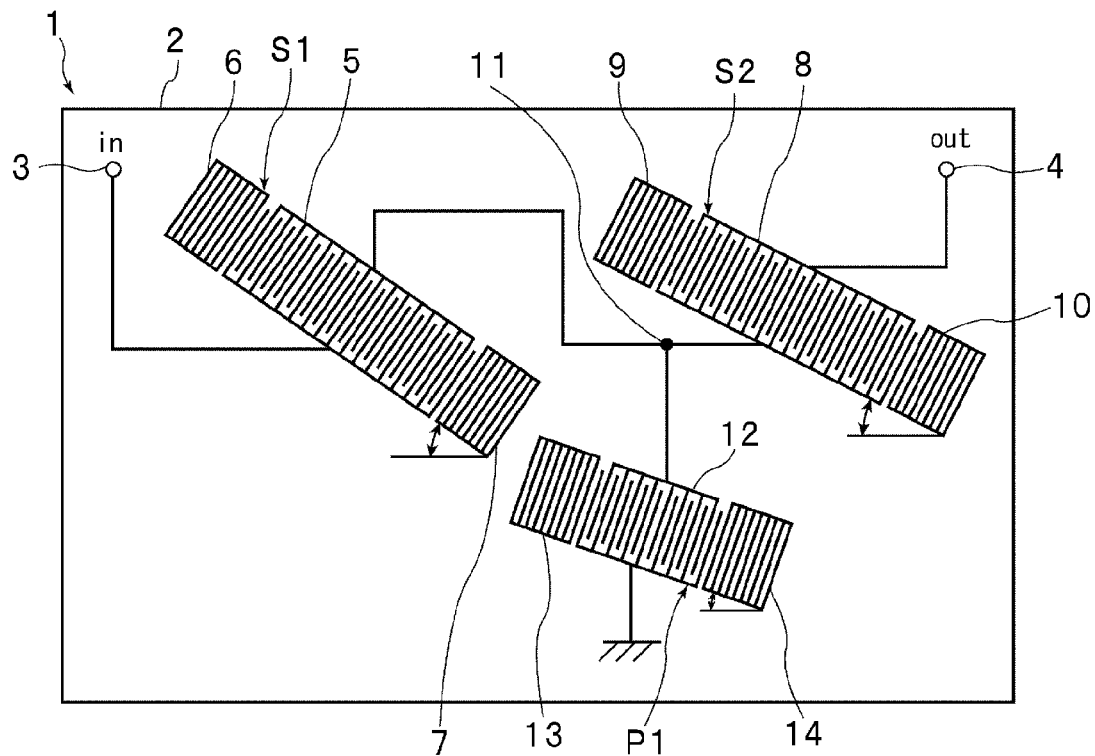
FIG. 1 is a schematic plan view illustrating an electrode structure of an acoustic wave filter device according to a first preferred embodiment of the present invention.
Figure 2:
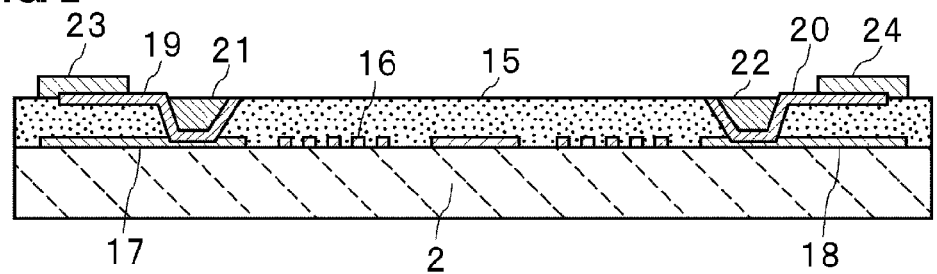
FIG. 2 is a schematic elevational cross-sectional view of an acoustic wave filter device according to the first preferred embodiment of the present invention.
Figure 3:
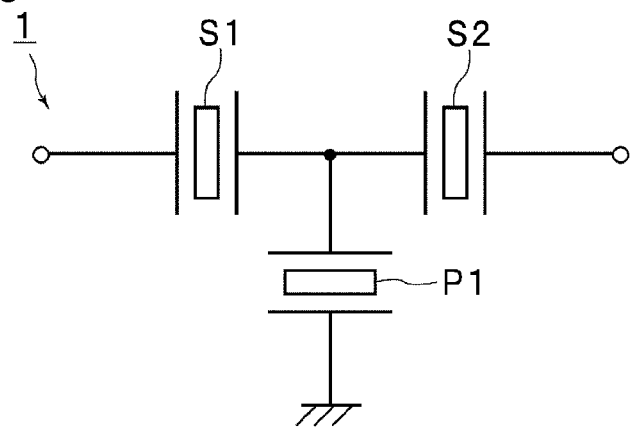
FIG. 3 is a circuit diagram of an acoustic wave filter device according to the first preferred embodiment of the present invention.

FIG. 1 is a schematic plan view illustrating an electrode structure of an acoustic wave filter device according to the first preferred embodiment of the present invention. FIG. 2 is a schematic elevational cross-sectional view showing a threedimensional structure of the acoustic wave filter device. FIG. 3 is a circuit diagram of the acoustic wave filter device.

As illustrated in FIG. 3, in an acoustic wave filter device 1 according to the present preferred embodiment, a first series arm resonator S1 and a second series arm resonator S2 are connected in series with each other at a series arm connecting an input terminal and an output terminal to each other. A parallel arm resonator P1 is inserted in a parallel arm connected between the series arm and a ground potential. That is, a ladder circuit is defined by two series arm resonators, the first series arm resonator S1 and the second series arm resonator S2, and a single parallel arm resonator, the parallel arm resonator P1.

More specifically, as illustrated in FIG. 1, in the acoustic wave filter device 1, an electrode structure is provided on a piezoelectric substrate 2. That is, the first series arm resonator S1 and the second series arm resonator S2 are connected between an input terminal 3 and an output terminal 4. Each of the first series arm resonator S1 and the second series arm resonator S2 is a one-port boundary acoustic wave resonator. More specifically, the first series arm resonator S1 includes an interdigital transducer (IDT) 5 and reflectors 6 and disposed on either side of the IDT 5 in a direction of propagation of a boundary wave. The second series arm resonator S2 similarly includes an IDT 8 and reflectors 9 and 10. In order to provide a parallel arm, the parallel arm resonator P1 that is a one-port boundary acoustic wave resonator is connected between the ground potential and a connection point 11 between the first series arm resonator S1 and the second series arm resonator S2. The parallel arm resonator P1 also includes an IDT 12 and reflectors 13 and 14 disposed on either side of the IDT 12 in a direction of propagation of a boundary wave.

In this preferred embodiment, since each of the first series arm resonator S1, the second series arm resonator S2, and the parallel arm resonator P1 is a boundary acoustic wave resonator, these electrodes are disposed at an interface between the piezoelectric substrate 2 and a dielectric layer 15 provided on the piezoelectric substrate 2 as illustrated in FIG. 2. Electrodes 16 including the first series arm resonator S1, the second series arm resonator S2, and the parallel arm resonator P1 are schematically illustrated in FIG. 2. The electrodes 16 are electrically connected to an input electrode pad 17 and an output electrode pad 18, however, the connection point between the electrodes 16 and each of the input electrode pad 17 and the output electrode pad 18 is not illustrated. As illustrated in FIG. 2, through-holes are provided in the dielectric layer 15 so as to expose the input electrode pad 17 and the output electrode pad 18. Connection conductors 19 and 20 are individually disposed in the through-holes, electrically connected to the electrode pads 17 and 18, and extend to the outside of the through-holes on the upper surface of the dielectric layer 15. Through-hole conductors 21 and 22 are individually filled in the through-holes.

Portions of the connection conductors 19 and 20 extending on the dielectric layer 15 are connected to an input terminal 23 and an output terminal 24, respectively. The input terminal 23 and the output terminal 24 correspond to the input terminal 3 and the output terminal 4, respectively, which are schematically illustrated in FIG. 1.

In a bandpass filter including a ladder circuit, a passband is formed by the impedance frequency characteristic of a series arm resonator and the impedance frequency characteristic of a parallel arm resonator. More specifically, a series arm resonator and a parallel arm resonator are selected so that the end portion of a passband on a higher-frequency side is formed by the anti-resonant frequency of the series arm resonator and the end portion of the passband on a lower-frequency side is formed by the resonant frequency of the parallel arm resonator.

In the acoustic wave filter device 1 according to the present preferred embodiment, the anti-resonant frequency of the first series arm resonator S1 is lower than that of the second series arm resonator S2. The resonant frequency of the first series arm resonator S1 is located in the passband. The electromechanical coupling coefficient $k^2$ of the first series arm resonator S1 is less than an average of the electromechanical coupling coefficients of the first series arm resonator S1 and the second series arm resonator S2. As a result, it is possible to increase the steepness of a filter characteristic at a boundary between a portion of the passband on a higher-frequency side and an attenuation band. Furthermore, a decrease in the loss in the passband rarely occurs. This will be described in detail with reference to FIGS. 4 to 7.

An acoustic wave filter device according to the above-described preferred embodiment and an acoustic wave filter device that is a first comparative example were produced as follows.

An $LiNbO_3$ substrate was used as the piezoelectric substrate 2. As ($\phi$, $\theta$, $\psi$) obtained when the crystalline cutting plane of the $LiNbO_3$ substrate and the propagation direction of an acoustic wave were represented in an Euler angle expression, Euler angles (0°, 105°, $\psi$) were set. As illustrated in Table 1 to be described later, the propagation directions $\psi$ of the first series arm resonator S1, the second series arm resonator S2, and the parallel arm resonator P1 were set to different values. An $SiO_2$ film with a thickness of about 10 μm was formed on the piezoelectric substrate 2 as the dielectric layer 15. The electrodes 16 were formed at an interface between the dielectric layer 15 and the piezoelectric substrate 2. The electrodes 16 were formed of an Au thin film with a thickness of about 0.05λ. λ represents the wavelength of a boundary acoustic wave at an center frequency in the passband of the acoustic wave filter device 1.

The setting values of the first series arm resonator S1, the second series arm resonator S2, and the parallel arm resonator P1 are illustrated in Table 1.

TABLE 1

|  | S1 | S2 | P1 |
|---|---|---|---|
| The Number of Pairs of IDTs (pair) | 60.0 | 72.0 | 30.0 |
| The Number of Pairs of Reflectors (pair) | 24.5 | 24.5 | 24.5 |
| Wavelength λ (μm) | 1.6215 | 1.6185 | 1.6500 |
| Cross Width (μm) | 40.0 | 40.0 | 40.0 |
| Duty | 0.40 | 0.40 | 0.40 |
| Propagation Direction $\psi$ (°) | 35 | 27 | 20 |

As described previously, the boundary acoustic wave propagation directions $\psi$ of the first series arm resonator S1 and the second series arm resonator S2 were set to different values, that is, about 35° and about 27°, respectively. Thus, by setting the boundary acoustic wave propagation directions $\psi$ of the first series arm resonator S1 and the second series arm resonator S2 to different values, the electromechanical coupling coefficient of the first series arm resonator S1 is preferably less than that of the second series arm resonator S2 in this preferred embodiment.

The first series arm resonator S1, the second series arm resonator S2, and the parallel arm resonator P1 included in a boundary acoustic wave device that is the first comparative example were designed as illustrated in Table 2. Except for the setting values illustrated in FIG. 2, a boundary acoustic wave device that is the first comparative example is the same or substantially the same as a boundary acoustic wave device according to the above-described preferred embodiment.

TABLE 2

|  | S1 | S2 | P1 |
|---|---|---|---|
| The Number of Pairs of IDTs (pair) | 70.0 | 70.0 | 30.0 |
| The Number of Pairs of Reflectors (pair) | 24.5 | 24.5 | 24.5 |
| Wavelength λ (μm) | 1.6215 | 1.6185 | 1.6500 |
| Cross Width (μm) | 40.0 | 40.0 | 40.0 |
| Duty | 0.40 | 0.40 | 0.40 |
| Propagation Direction ψ (°) | 30 | 30 | 20 |

That is, in an acoustic wave filter device that is the first comparative example, the propagation directions ψ of the first series arm resonator S1 and the second series arm resonator S2 were set to about 30°. Accordingly, the electromechanical coupling coefficient $k^2$ of the first series arm resonator S1 is equal or substantially equal to that of the second series arm resonator S2.

Figure 4:
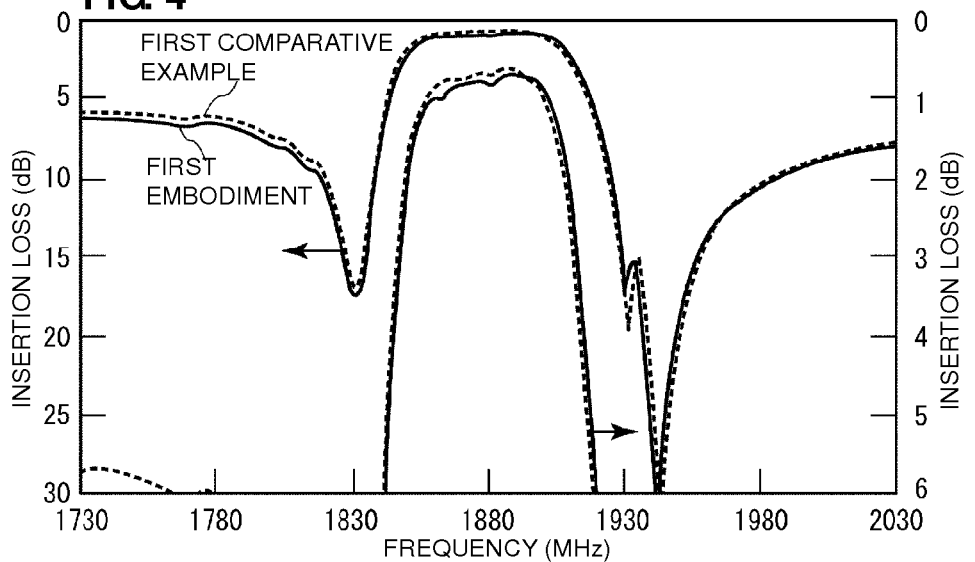
FIG. 4 is a diagram illustrating attenuation frequency characteristics of an acoustic wave filter device according to the first preferred embodiment of the present invention and an acoustic wave filter device that is a comparative example.

FIG. 4 is a diagram illustrating the attenuation frequency characteristics of an acoustic wave filter device according to the above-described preferred embodiment and an acoustic wave filter device that is the first comparative example. As shown in FIG. 4, according to the above-described preferred embodiment, it is possible to increase the steepness of an attenuation characteristic on a higher-frequency side of a passband, and an insertion loss in the passband is not significantly increased. That is, when the steepness of a filter characteristic of an acoustic wave filter device according to the above-described preferred embodiment and the steepness of a filter characteristic of an acoustic wave filter device that is the first comparative example are compared with each other in a frequency bandwidth between a frequency position corresponding to an insertion loss of about 3 dB and a frequency position corresponding to an insertion loss of about 15 dB, a steepness of about 17.2 MHz is obtained in an acoustic wave filter device that is the first comparative example and a steepness of about 16.1 MHz is obtained in an acoustic wave filter device according to the above-described preferred embodiment. That is, the steepness is improved by about 1.1 MHz.

The reason that the steepness is increased on a higher-frequency side of the passband in this preferred embodiment is as follows.

Figure 5:
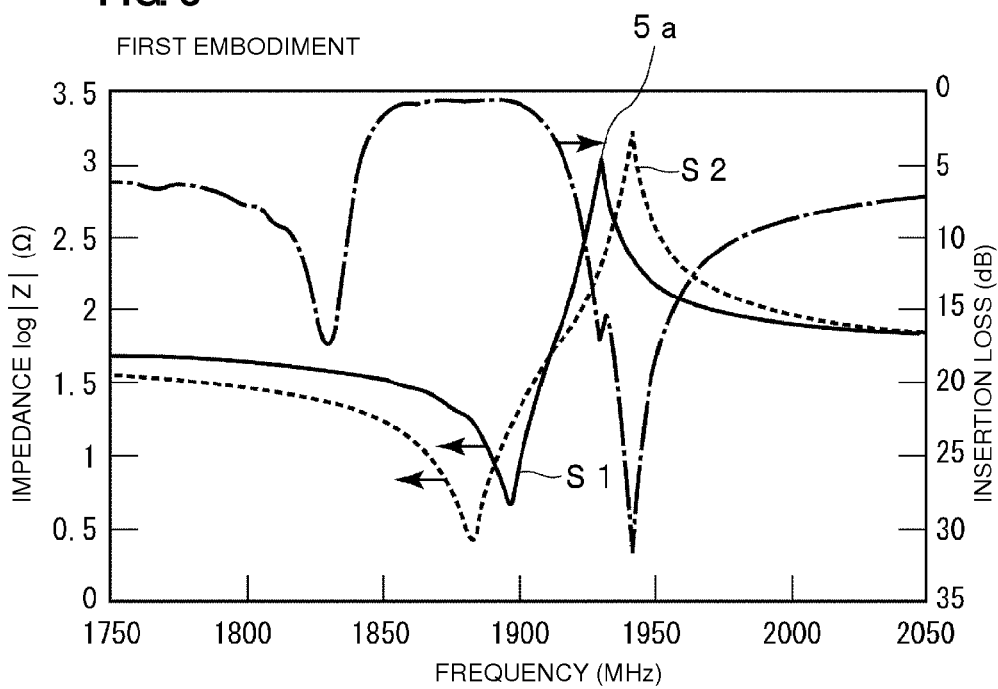
FIG. 5 is a diagram illustrating the attenuation characteristic of an acoustic wave filter device according to the first preferred embodiment of the present invention and the impedance frequency characteristics of a first series arm resonator and a second series arm resonator which are used in the acoustic wave filter device.
Figure 6:
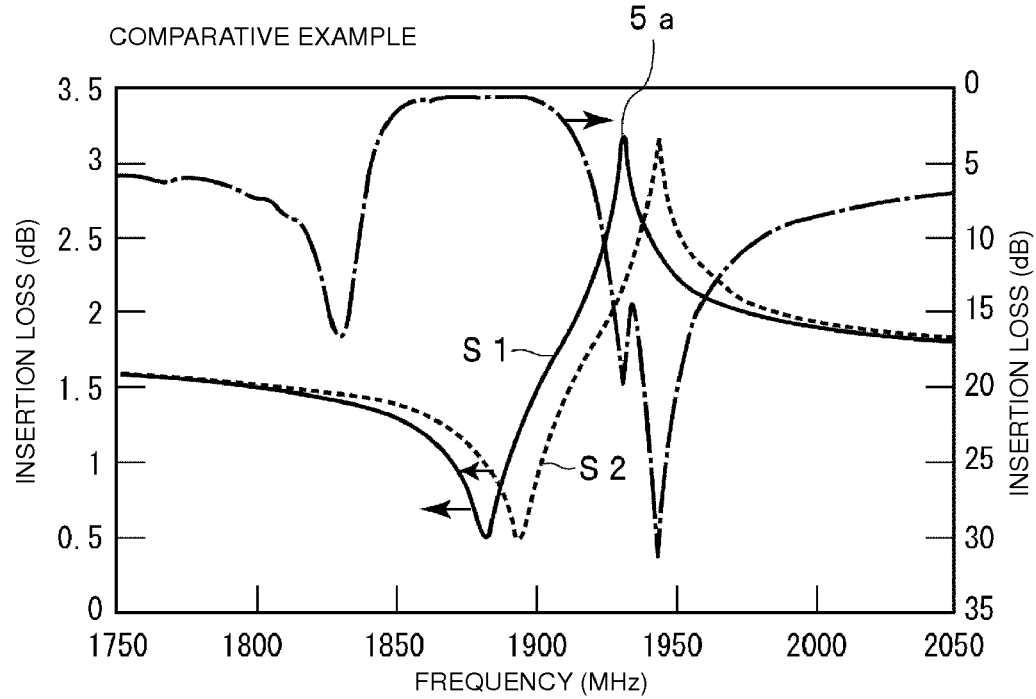
FIG. 6 is a diagram illustrating the attenuation frequency characteristic of an acoustic wave filter device that is a comparative example and the impedance frequency characteristics of a first series arm resonator and a second series arm resonator which are used in the acoustic wave filter device.

FIG. 5 is a diagram illustrating the attenuation frequency characteristic of a boundary acoustic wave device according to the above-described preferred embodiment and the impedance characteristics of the first series arm resonator S1 and the second series arm resonator S2. FIG. 6 is a diagram illustrating the attenuation frequency characteristic of a boundary acoustic wave device that is the first comparative example and the impedance characteristics of the first series arm resonator S1 and the second series arm resonator S2 which are included in the boundary acoustic wave device.

As shown in FIG. 5, the steepness on a higher-frequency side of a passband is formed by an anti-resonant frequency fa of the first series arm resonator S1.

As shown in FIG. 6, the steepness on a higher-frequency side of a passband is similarly formed by the anti-resonant frequency fa of the first series arm resonator S1 in a boundary acoustic wave device that is the first comparative example.

Figure 7:
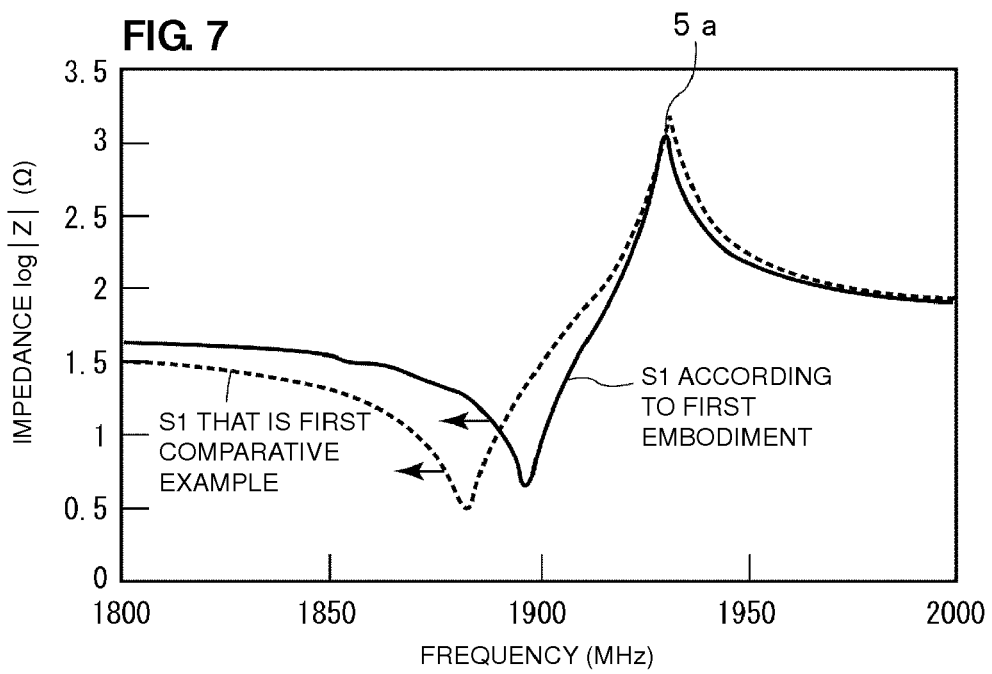
FIG. 7 is a diagram illustrating the impedance frequency characteristics of a series arm resonator included in an acoustic wave filter device according to the first preferred embodiment of the present invention and a series arm resonator included in an acoustic wave filter device that is a comparative example.

FIG. 7 is a diagram illustrating the impedance characteristics of the first series arm resonator S1 included in an acoustic wave filter device according to the above-described preferred embodiment and the first series arm resonator S1 included in an acoustic wave filter device that is the first comparative example. Since the propagation direction ψ of the first series arm resonator S1 was changed from about 30° to about 35°, the electromechanical coupling coefficient $k^2$ of the first series arm resonator S1 became small. Accordingly, as shown in FIG. 7, the interval between a resonant frequency and an anti-resonant frequency is relatively narrow. In this preferred embodiment, the steepness of a filter characteristic is therefore increased in the vicinity of the anti-resonant frequency fa of the first series arm resonator S1. As a result, the steepness on a higher-frequency side of a passband is increased in the acoustic wave filter device 1.

The relationship between the propagation direction ψ and the electromechanical coupling coefficient $k^2$ is disclosed in, for example, WO2004/070946. WO2004/070946 discloses the relationship between the propagation direction ψ and the electromechanical coupling coefficient $k^2$ when a configuration in which an Au electrode is provided on an LiNbo$_3$ substrate having Euler angles (0°, 105°, ψ) and an SiO$_2$ film is further provided on the LiNbo$_3$ substrate is used. That is, WO2004/070946 discloses that an electromechanical coupling coefficient is reduced with the increase in the propagation direction ψ. Accordingly, the propagation direction ψ of the first series arm resonator S1 is selected so that the electromechanical coupling coefficient of the first series arm resonator S1 is less than an average of the electromechanical coupling coefficients of all of remaining series arm resonators.

On the other hand, the propagation direction ψ of the second series arm resonator S2 included in an acoustic wave filter device according to the above-described preferred embodiment is set to a small value, that is, about 27°. Accordingly, the electromechanical coupling coefficient $k^2$ of the second series arm resonator S2 included in an acoustic wave filter device according to the above-described preferred embodiment is greater than that of the second series arm resonator S2 having the propagation direction ψ of about 30° included in an acoustic wave filter device that is the first comparative example. As shown in FIGS. 5 and 6, the anti-resonant frequency of the second series arm resonator S2 does not contribute to the steepness on a higher-frequency side of the passband. An impedance characteristic obtained in the vicinity of the anti-resonant frequency of the second series arm resonator S2 increases the amount of attenuation on a higher-frequency side of the passband. Accordingly, even if the electromechanical coupling coefficient of the second series arm resonator S2 is increased as in the above-described preferred embodiment, the deterioration of the steepness on a higher-frequency side of the passband does not occur.

Even if only the propagation direction ψ of the first series arm resonator S1 is increased to increase the steepness on a higher-frequency side of the passband, a passband width is reduced and the amount of attenuation on a higher-frequency side of the passband is deteriorated. However, by also reducing the propagation direction ψ of the second series arm resonator S2, that is, by also setting the electromechanical coupling coefficient of the second series arm resonator S2 to a relatively large value, the sufficiently wide width of the passband on a higher-frequency side can be obtained. Furthermore, it is possible to increase the steepness in the vicinity of the passband without the deteriorating the amount of attenuation over a wide range of frequencies on a higher-frequency side of the passband.

As described in WO2004/070946, the electromechanical coupling coefficient $k^2$ can be freely changed within the range of about 16% to about 0% by changing the propagation direction ψ. Accordingly, as compared to a case in which a method disclosed in Japanese Unexamined Patent Application Publication No. 2004-343168 is used, that is, an efficient electromechanical coupling coefficient is changed by connecting a capacitor, the electromechanical coupling coefficient $k^2$ can be changed to a greater extent.

With the configuration disclosed in Japanese Unexamined Patent Application Publication No. 2004-343168 in which a capacitor is connected in parallel to a parallel arm resonator, the problem of an increase in an insertion loss in a passband arises. On the other hand, if an electromechanical coupling coefficient is changed by changing the acoustic wave propagation direction $\psi$ on the piezoelectric substrate 2 as in this preferred embodiment, the increase in an insertion loss in a passband does not readily occur. Accordingly, it is possible to increase the steepness of a filter characteristic on a higher-frequency side of a passband and achieve a low loss.

Furthermore, in this preferred embodiment, since the propagation direction $\psi$ of the first series arm resonator S1 forming the steepness on a higher-frequency side of a passband is set to a relatively large value, a temperature coefficient of resonant frequency TCF on a higher-frequency side of a passband is also improved. The relationship between the propagation direction $\psi$ and the temperature coefficient of resonant frequency TCF is disclosed in FIG. 84 of WO2004/070946. If the propagation direction $\psi$ is increased from the propagation direction $\psi$ of about 45° or less, the absolute value of the temperature coefficient of resonant frequency TCF is monotonously reduced as described in WO2004/070946. Accordingly, by increasing the propagation direction $\psi$ as described above, it is possible to reduce the absolute value of the temperature coefficient of resonant frequency TCF and improve a frequency temperature characteristic.

As is apparent from the above-described preferred embodiment, by locating the resonant frequency of the first series arm resonator S1 having an anti-resonant frequency lower than that of the second series arm resonator S2 in a passband and setting the electromechanical coupling coefficient $k^2$ of the first series arm resonator S1 to a relatively small value, it is possible to improve the steepness on a higher-frequency side of the passband.

In the above-described preferred embodiment, a ladder filter in which the first series arm resonator S1, the second series arm resonator S2, and the parallel arm resonator P1 are connected in a "T" configuration has been described. However, the present invention is not limited thereto, and a ladder filter in which resonators are connected in a "π" configuration may be used. That is, a ladder filter in which two or more stages each composed of a single series arm resonator and two parallel arm resonators connected to the series arm resonator are connected may be used. Furthermore, a ladder circuit may be configured by connecting four or more resonators.

In that case, the anti-resonant frequency of at least one of a plurality of series arm resonators is set so that it is less than that of the remaining ones of these series arm resonators. The resonant frequency of one of these series arm resonators having the lowest anti-resonant frequency is located in a passband, and the electromechanical coupling coefficient of the series arm resonator is set to a relatively small value. As a result, similar to the above-described preferred embodiment, it is possible to improve the steepness of a filter characteristic on a higher-frequency side of a passband without deteriorating the insertion loss in the passband.

In the case of a ladder filter in which a plurality of parallel arm resonators are individually disposed at a plurality of parallel arms, contrary to the above-described case, the resonant frequency of at least one of a plurality of parallel arm resonators is set so that it is higher than that of the remaining ones of these parallel arm resonators. The anti-resonant frequency of one of these parallel arm resonators having the highest resonant frequency is located in a passband, and the electromechanical coupling coefficient of the parallel arm resonator is set to a relatively small value. As a result, contrary to the above-described preferred embodiment, it is possible to improve the steepness of a filter characteristic on a lower-frequency side of a passband without increasing the insertion loss in the passband.

It is preferable that a plurality of parallel arms and a plurality of parallel arm resonators that are individually disposed at these parallel arms be used in addition to the components described in the above-described preferred embodiments and these parallel arm resonators be used to increase the steepness of a filter characteristic on a lower-frequency side of a passband as described above. That is, it is preferable that the resonant frequency of at least one of a plurality of parallel arm resonators be different from that of remaining ones of these parallel arm resonators, the anti-resonant frequency of one of these parallel arm resonators having the highest resonant frequency be located in the passband, and the electromechanical coupling coefficient of the parallel arm resonator be less than an average of the electromechanical coupling coefficients of all of these parallel arm resonators.

A method of setting an electromechanical coupling coefficient to a relatively small value in order to increase the steepness of a filter characteristic on a lower-frequency side of a passband in a filter including a plurality of parallel arm resonators is not limited to the above-described method of increasing the propagation direction $\psi$, and various other methods may be used.

As described previously in the above-described preferred embodiments, the resonant frequency of the first series arm resonator S1 is preferably set so that it is less than an average of electromechanical coupling coefficients of the first series arm resonator S1 and the second series arm resonator S2. As a result, the electromechanical coupling coefficient of the first series arm resonator S1 is set to a relatively small value. When a plurality of parallel arm resonators are used and at least one of these parallel arm resonators has a resonant frequency different from the resonant frequency of the remaining ones of these parallel arm resonators and has a relatively small electromechanical coupling coefficient, the electromechanical coupling coefficient of the parallel arm resonator having the highest resonant frequency may preferably be similarly set so that it is less than an average of electromechanical coupling coefficients of all of these parallel arm resonators.

An $LiNbO_3$ substrate having Euler angles (0°, 105°, $\psi$) is preferably used, for example, in the above-described preferred embodiment. However, an $LiNbO_3$ substrate having other Euler angles may be used. Alternatively, a substrate made of another piezoelectric monocrystal such as $LiTaO_3$ or crystal may be used.

The electrode configuration 16 is preferably formed of an Au film, for example, but may be formed of another metal such as Al, Cu, or Pt or an appropriate alloy such as an alloy of Ag and Pd, for example. Alternatively, the electrode configuration 16 may be formed of a stacked metal film obtained by stacking a plurality of metal films.

The dielectric layer 15 is preferably made of $SiO_2$, but may be made of another appropriate dielectric material such as SiN or $Al_2O_3$, for example. In the case of the dielectric layer made of $SiO_2$ having a positive temperature coefficient of resonant frequency TCF, it is preferable that the dielectric layer 15 be used with a piezoelectric substrate having a negative temperature coefficient of resonant frequency TCF to reduce the absolute value of the temperature coefficient of resonant frequency TCF. That is, since LiNbO₃ or LiTaO₃ has a negative temperature coefficient of resonant frequency, it is preferable that the dielectric layer 15 be made of a dielectric material having a positive temperature coefficient of resonant frequency.

In the above-described preferred embodiment, the electrode structures of the first series arm resonator S1, the second series arm resonator S2, and the parallel arm resonator P1 are schematically illustrated. It is to be noted that modifications may be made to IDTs and reflectors included in these resonators. For example, apodization weighting may be performed on these IDTs, dummy electrode fingers may be added, and the reflectors may not be disposed.

Second Preferred Embodiment

Figure 8:
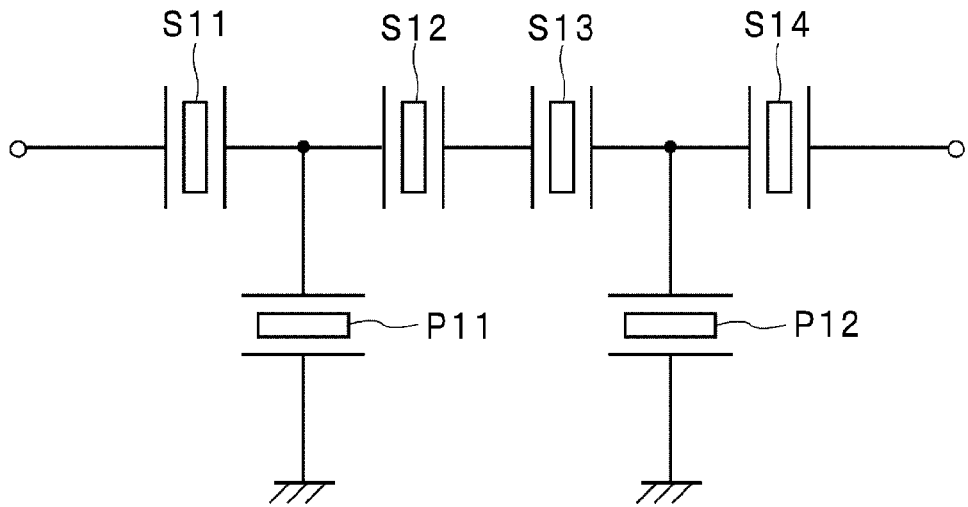
FIG. 8 is a circuit diagram of an acoustic wave filter device according to a second preferred embodiment of the present invention.

FIG. 8 is a circuit diagram of an acoustic wave filter device having a ladder circuit configuration according to the second preferred embodiment of the present invention. In this preferred embodiment, the same or substantially the same piezoelectric substrate, the same or substantially the same material for forming an electrode structure, and the same or substantially the same material for forming a dielectric layer as those used in the first preferred embodiment are used, and only a circuit configuration is changed as shown in FIG. 8. That is, an acoustic wave filter device 21 according to the second preferred embodiment includes a first series arm resonator S11, a second series arm resonator S12, a third series arm resonator S13, a fourth series arm resonator S14, a first parallel arm resonator P11, and a second parallel arm resonator P12. The first parallel arm resonator P11 and the second parallel arm resonator P12 are disposed at a first parallel arm and a second parallel arm, respectively, each of which connects series arm resonators and a ground potential to one another.

The first series arm resonator S11, the second series arm resonator S12, the third series arm resonator S13, the fourth series arm resonator S14, the first parallel arm resonator P11, and the second parallel arm resonator P12 included in an acoustic wave filter device according to the second preferred embodiment were designed as illustrated in Table 3.

An acoustic wave filter device that is a second comparative example to be compared with an acoustic wave filter device according to the second preferred embodiment was prepared. An acoustic wave filter device that is the second comparative example is the same or substantially the same as an acoustic wave filter device according to the second preferred embodiment, except for the configurations of the first series arm resonator S11, the second series arm resonator S12, the third series arm resonator S13, the fourth series arm resonator S14, the first parallel arm resonator P11, and the second parallel arm resonator P12 illustrated in Table 4.

TABLE 3

|  | S11 | S12 | S13 | S14 | P11 | P12 |
|---|---|---|---|---|---|---|
| The Number of Pairs of IDTs (pair) | 76.5 | 19.5 | 53.5 | 118.5 | 92.0 | 93.5 |
| The Number of Pairs of Reflectors (pair) | 24.5 | 24.5 | 24.5 | 24.5 | 24.5 | 24.5 |
| Wavelength λ (µm) | 1.6186 | 1.5927 | 1.6006 | 1.6343 | 1.6826 | 1.6818 |
| Cross Width (µm) | 38.7 | 39.5 | 73.5 | 57.1 | 65.5 | 60.2 |
| Duty | 0.40 | 0.40 | 0.40 | 0.40 | 0.40 | 0.40 |
| Propagation Direction ψ (°) | 22.7 | 3.9 | 38.0 | 28.4 | 28.1 | 28.1 |

TABLE 4

|  | S11 | S12 | S13 | S14 | P11 | P12 |
|---|---|---|---|---|---|---|
| The Number of Pairs of IDTs (pair) | 77.5 | 25.5 | 55.5 | 122.5 | 112.5 | 92.0 |
| The Number of Pairs of Reflectors (pair) | 24.5 | 24.5 | 24.5 | 24.5 | 24.5 | 24.5 |
| Wavelength λ (µm) | 1.6194 | 1.5904 | 1.6265 | 1.6382 | 1.6849 | 1.6841 |
| Cross Width (µm) | 46.7 | 38.7 | 67.0 | 56.4 | 67.4 | 70.3 |
| Duty | 0.40 | 0.40 | 0.40 | 0.40 | 0.40 | 0.40 |
| Propagation Direction ψ (°) | 20.4 | 20.4 | 20.4 | 20.4 | 28.2 | 28.2 |

As shown in Table 3, the boundary acoustic wave propagation directions ψ of the first series arm resonator S11, the second series arm resonator S12, the third series arm resonator S13, and the fourth series arm resonator S14 included in an acoustic wave filter device according to the second preferred embodiment are set to about 22.7°, about 3.9°, about 38.0°, and about 28.4°, respectively. On the other hand, the propagation directions ψ of the first series arm resonator S11, the second series arm resonator S12, the third series arm resonator S13, and the fourth series arm resonator S14 included in an acoustic wave filter device that is the second comparative example are set to about 20.4°.

The propagation directions ψ of the first parallel arm resonator P11 and the second parallel arm resonator P12 included in an acoustic wave filter device according to the second preferred embodiment are set to different values, about 28.1° and about 26.2°, respectively. On the other hand, the propagation directions ψ of the first parallel arm resonator P11 and the second parallel arm resonator P12 included in an acoustic wave filter device that is the second comparative example are set to about 28.2°.

Figure 9:
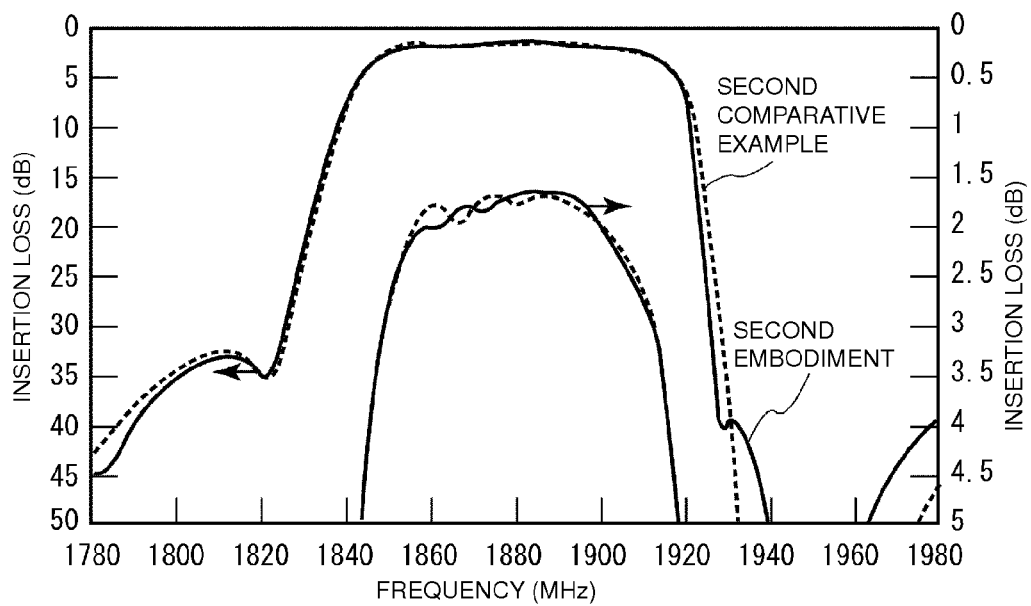
FIG. 9 is a diagram illustrating the attenuation frequency characteristics of an acoustic wave filter device according to the second preferred embodiment and an acoustic wave filter device that is a second comparative example.

FIG. 9 is a diagram illustrating the attenuation frequency characteristics of an acoustic wave filter device according to the second preferred embodiment and an acoustic wave filter device that is the second comparative example. As is apparent from FIG. 9, the steepness of a filter characteristic of an acoustic wave filter device according to the second preferred embodiment is greater than that of an acoustic wave filter device that is the second comparative example on a higher-frequency side of a passband. More specifically, in both of these acoustic wave filter devices, the frequency bandwidth between a frequency corresponding to an insertion loss of about 4.0 dB and a frequency corresponding to an insertion loss of about 25 dB is about 17 MHz in the vicinity of an end portion of a passband on a lower-frequency side, for example. On the other hand, the frequency bandwidth between a frequency corresponding to an insertion loss of about 4.4 dB and a frequency corresponding to an insertion loss of about 37 dB on a higher-frequency side of the passband is about 13.6 MHz in an acoustic wave filter device that is the second comparative example and about 11.6 MHz in an acoustic wave filter device according to the second preferred embodiment. That is, the steepness of a filter characteristic is improved by about 2.0 MHz.

The reason that the steepness of a filter characteristic on a higher-frequency side of the passband is improved as described previously is as follows.

Figure 10:
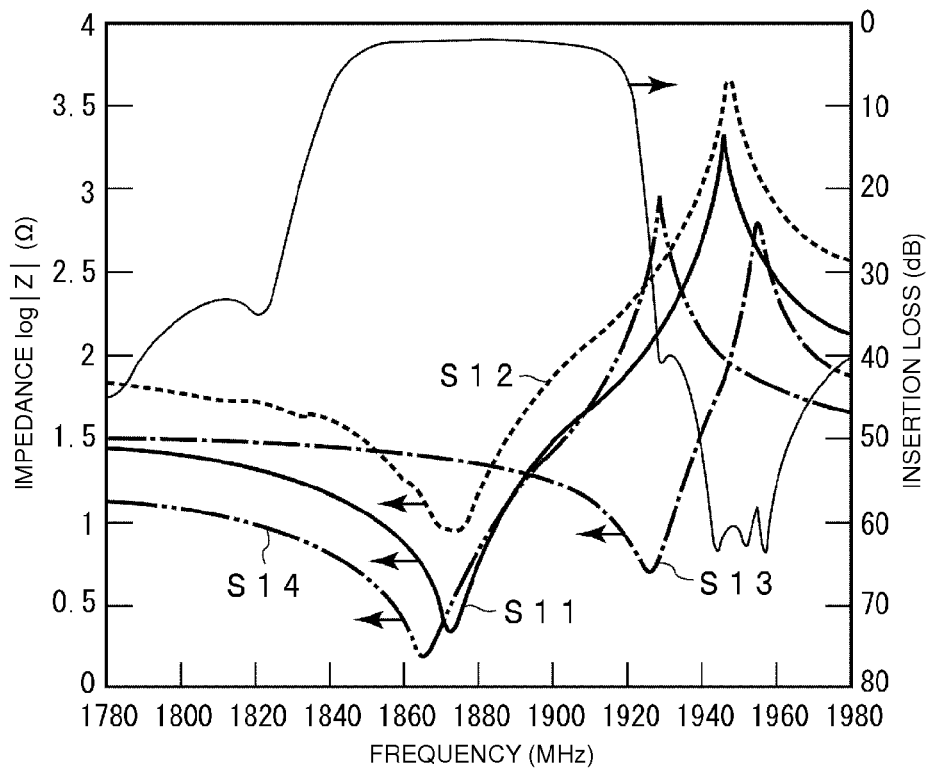
FIG. 10 is a diagram illustrating the attenuation frequency characteristic of an acoustic wave filter device according to the second preferred embodiment and the impedance frequency characteristics of a first series arm resonator, a second series arm resonator, a third series arm resonator, and a fourth series arm resonator which are used in the acoustic wave filter device.
Figure 11:
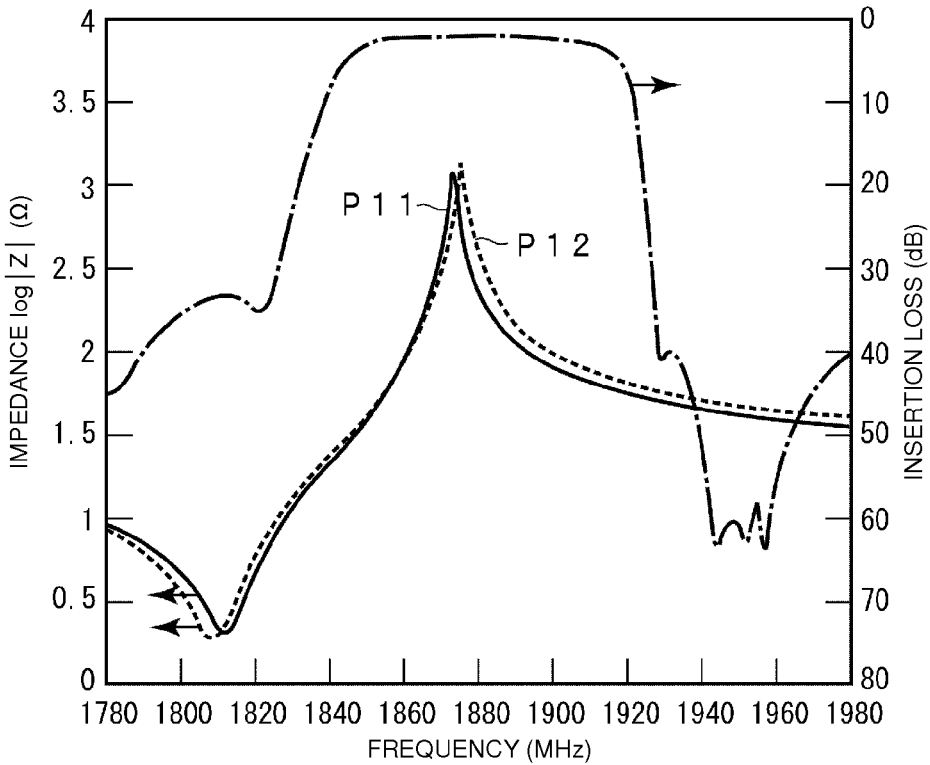
FIG. 11 is a diagram illustrating the attenuation frequency characteristic of an acoustic wave filter device according to the second preferred embodiment and the impedance frequency characteristics of a first parallel arm resonator and a second parallel arm resonator which are used in the acoustic wave filter device.

FIG. 10 is a diagram illustrating the attenuation frequency characteristic of an acoustic wave filter device according to the above-described preferred embodiment and the impedance characteristics of the first series arm resonator S11, the second series arm resonator S12, the third series arm resonator S13, and the fourth series arm resonator S14 which are used in the acoustic wave filter device. FIG. 11 is a diagram illustrating the attenuation frequency characteristic of an acoustic wave filter device according to the above-described preferred embodiment and the impedance characteristics of the first parallel arm resonator P11 and the second parallel arm resonator P12 which are used in the acoustic wave filter device. As shown in FIG. 10, the fourth series arm resonator S14 defines the steepness on a higher-frequency side of a passband. The propagation direction ψ of the fourth series arm resonator S14 is about 28.4°. On the other hand, an arithmetic mean of the propagation directions ψ of all series arm resonators is about 23.3°. Accordingly, the propagation direction ψ of the fourth series arm resonator S14 is relatively large, and the electromechanical coupling coefficient $k^2$ of the fourth series arm resonator S14 is therefore less than an average of the electromechanical coupling coefficients of all of the series arm resonators.

A series arm resonator having the largest propagation direction ψ is not the fourth series arm resonator S14 but the third series arm resonator S13. However, as is clear from this preferred embodiment, a series arm resonator defining the steepness in the vicinity of a passband does not necessarily have the largest propagation direction ψ and the smallest electromechanical coupling coefficient of all resonators. That is, the electromechanical coupling coefficient $k^2$ of a resonator defining the steepness in the vicinity of a passband, that is, the fourth series arm resonator S14 in this preferred embodiment, may be less than an average of the electromechanical coupling coefficients $k^2$ of all series arm resonators.

Figure 12:
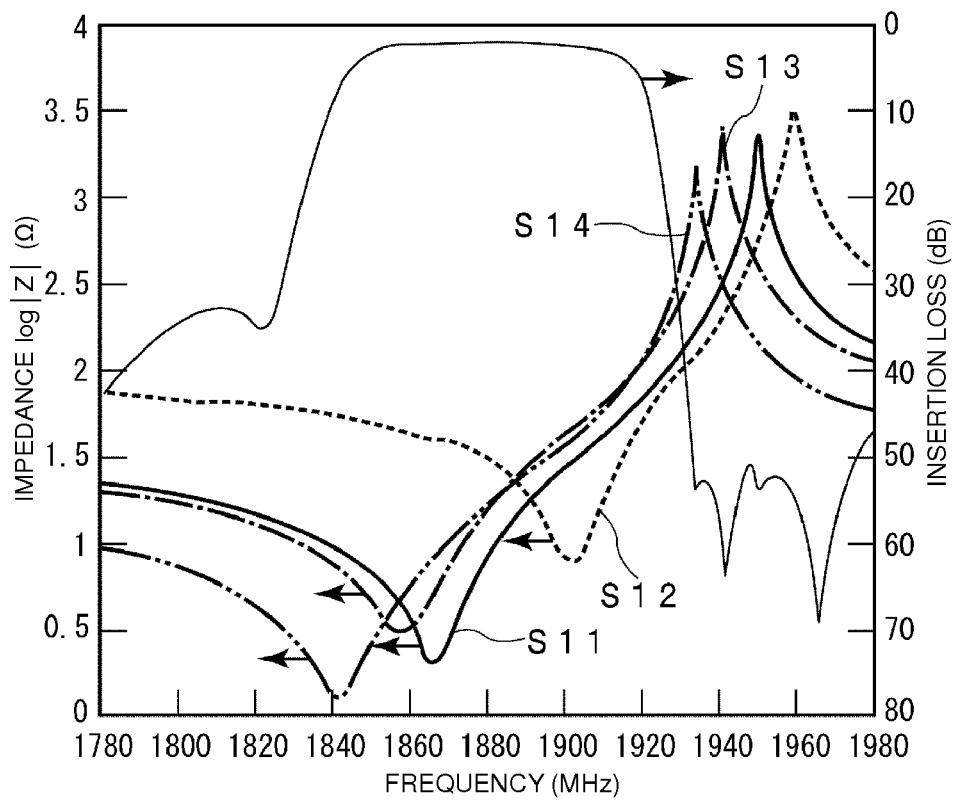
FIG. 12 is a diagram illustrating the attenuation frequency characteristic of an acoustic wave filter device that is the second comparative example and the impedance frequency characteristics of a first series arm resonator, a second series arm resonator, a third series arm resonator, and a fourth series arm resonator which are used in the acoustic wave filter device.
Figure 13:
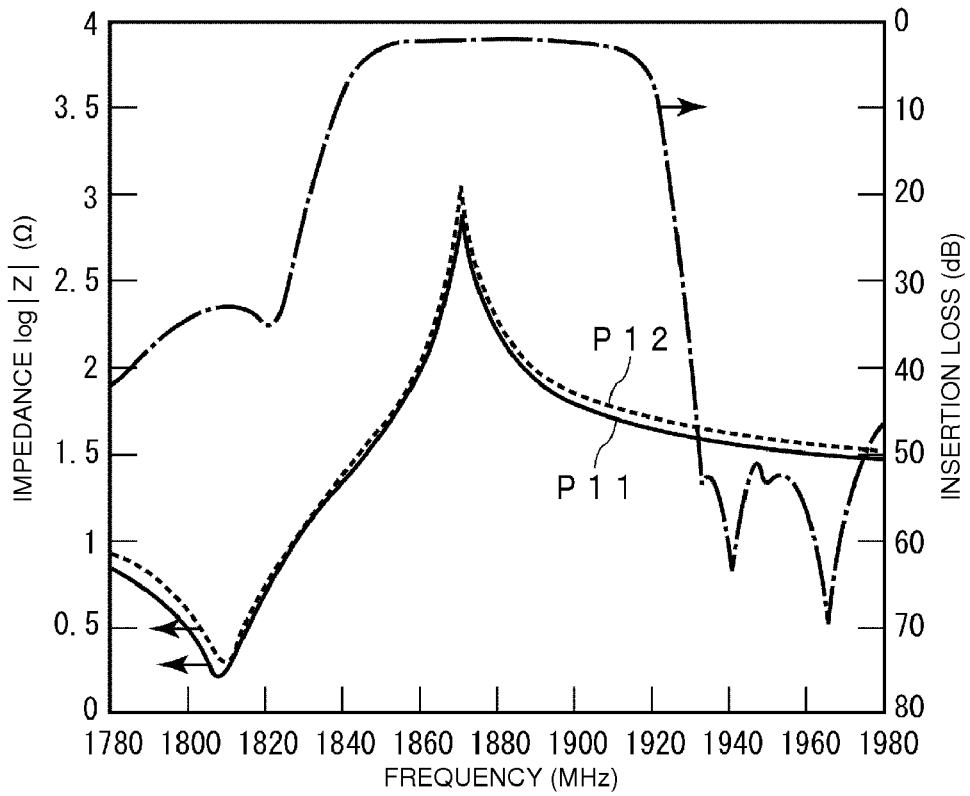
FIG. 13 is a diagram illustrating the attenuation frequency characteristic of an acoustic wave filter device that is the second comparative example and the impedance frequency characteristics of a first parallel arm resonator and a second parallel arm resonator which are used in the acoustic wave filter device.
Figure 14:
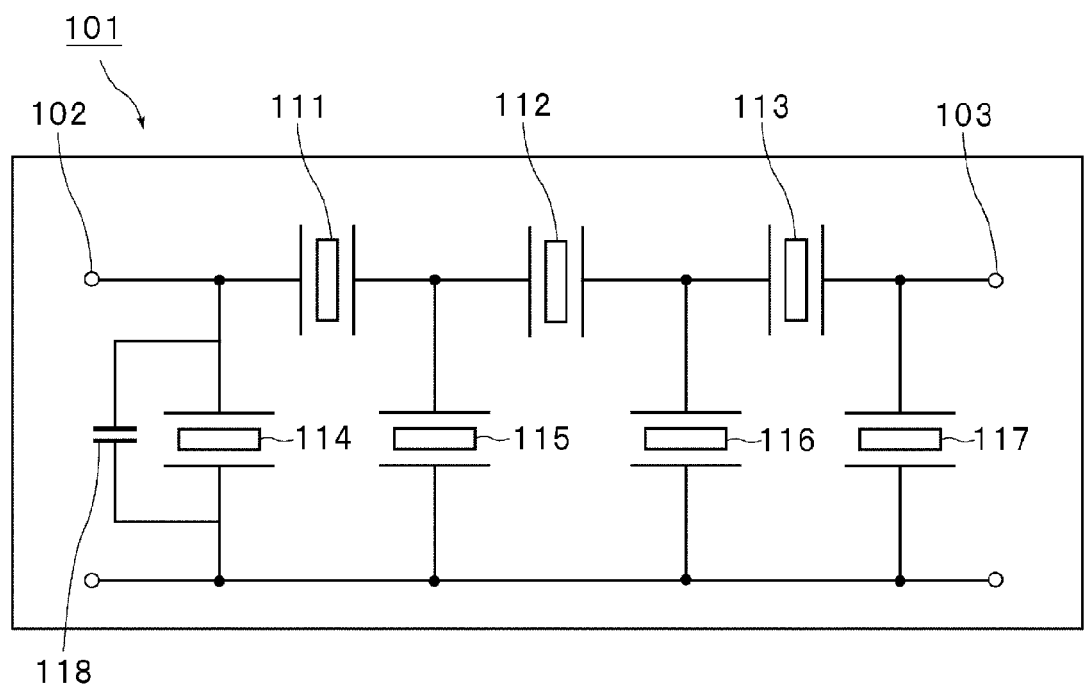
FIG. 14 is a circuit diagram of a filter device having a ladder circuit configuration in the related art.

FIG. 12 is a diagram illustrating the attenuation frequency characteristic of an acoustic wave filter device that is the second comparative example and the impedance characteristics of the first series arm resonator S11, the second series arm resonator S12, the third series arm resonator S13, and the fourth series arm resonator S14 which are used in the acoustic wave filter device. FIG. 13 is a diagram illustrating the attenuation frequency characteristic of an acoustic wave filter device that is the second comparative example and the impedance characteristics of the first parallel arm resonator P11 and the second parallel arm resonator P12 which are used in the acoustic wave filter device. The propagation directions ψ of all of the series arm resonators S11 to S14 are about 20.4°.

As is clear from the comparison between the second comparative example and the second preferred embodiment, the propagation direction ψ of the fourth series arm resonator S14 defining the steepness in the vicinity of a passband is about 20.4° in the second comparative example, and about 28.4° in the above-described preferred embodiment. As described previously, the steepness on a higher-frequency side of the passband is improved by about 2.0 MHz. Furthermore, since the propagation direction φ is increased by about 8°, the temperature coefficient of resonant frequency TCF in the vicinity of an end portion of the passband on a higher-frequency side is also improved by about 2 ppm.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device having a ladder circuit configuration comprising:
    a plurality of series arm resonators connected in series with one another at a series arm connecting an input terminal and an output terminal;
    a parallel arm resonator disposed at a parallel arm connected between the series arm and a ground potential;
    a piezoelectric substrate made of a piezoelectric monocrystal; and
    electrodes provided on the piezoelectric substrate; wherein
    an anti-resonant frequency of at least one of the plurality of series arm resonators is different from that of remaining ones of the plurality of series arm resonators;
    one of the plurality of series arm resonators having the lowest anti-resonant frequency has a resonant frequency located in a passband and an electromechanical coupling coefficient $k^2$ less than an average of electromechanical coupling coefficients of all of the plurality of series arm resonators; and
    a propagation direction ψ obtained when a crystalline cutting plane of the piezoelectric substrate and an acoustic wave propagation direction are expressed as Euler angles (φ, θ, ψ) is such that an electromechanical coupling coefficient of one of the plurality of series arm resonators having the lowest anti-resonant frequency is less than an average of electromechanical coupling coefficients of all of the plurality of series arm resonators.

2. The acoustic wave filter device according to claim 1, wherein
    a plurality of parallel arm resonators are individually disposed at a plurality of parallel arms;
    a resonant frequency of at least one of the plurality of parallel arm resonators is different from that of remaining ones of the plurality of parallel arm resonators; and
    one of the plurality of parallel arm resonators having the highest resonant frequency has an anti-resonant frequency located in a passband and an electromechanical coupling coefficient less than an average of electromechanical coupling coefficients of all of the plurality of parallel arm resonators.

3. The acoustic wave filter device according to claim 1, wherein the acoustic wave filter device is a boundary acoustic wave filter device.

4. The acoustic wave filter device according to claim 1, wherein the acoustic wave filter device is a surface acoustic wave filter device.

5. An acoustic wave filter device comprising:
    at least one series arm resonator arranged to define a series arm between an input terminal and an output terminal;
    a plurality of parallel arm resonators that are individually disposed at a plurality of parallel arms connecting the series arm and a ground potential;
    a piezoelectric substrate made of a piezoelectric monocrystal; and electrodes provided on the piezoelectric substrate; wherein
a resonant frequency of at least one of the plurality of parallel arm resonators is different from that of remaining ones of the plurality of parallel arm resonators;
one of the plurality of parallel arm resonators having the highest resonant frequency has an anti-resonant frequency located in a passband and an electromechanical coupling coefficient less than an average of electromechanical coupling coefficients of all of the plurality of parallel arm resonators; and
a propagation direction $\psi$ obtained when a crystalline cutting plane of the piezoelectric substrate and an acoustic wave propagation direction are expressed as Euler angles ($\phi$, $\theta$, $\psi$) is such that an electromechanical coupling coefficient of one of the plurality of parallel arm resonators having the lowest anti-resonant frequency is less than an average of electromechanical coupling coefficients of all of the plurality of parallel arm resonators.

6. The acoustic wave filter device according to claim 5, wherein the acoustic wave filter device is a boundary acoustic wave filter device.

7. The acoustic wave filter device according to claim 5, wherein the acoustic wave filter device is a surface acoustic wave filter device.

* * * * *